United States Patent
Mulligan et al.

(10) Patent No.: US 6,333,457 B1
(45) Date of Patent: Dec. 25, 2001

(54) EDGE PASSIVATED SILICON SOLAR/PHOTO CELL AND METHOD OF MANUFACTURE

(75) Inventors: William P. Mulligan, San Jose; Pierre J. Verlinden, Palo Alto, both of CA (US)

(73) Assignee: SunPower Corporation, Sunnyvale, CA (US)

(*) Notice: Subject to any disclaimer, the term of this patent is extended or adjusted under 35 U.S.C. 154(b) by 0 days.

(21) Appl. No.: 09/650,222

(22) Filed: Aug. 29, 2000

(51) Int. Cl.[7] .................. H01L 31/068; H01L 31/078
(52) U.S. Cl. .................. 136/255; 136/249; 136/256; 136/261; 257/431; 257/452; 257/461; 257/463; 250/200; 438/68; 438/57
(58) Field of Search .................. 136/249 MS, 255, 136/256, 261; 257/431, 452, 461, 463; 250/200; 438/68, 57

(56) References Cited

U.S. PATENT DOCUMENTS

| | | | |
|---|---|---|---|
| 4,797,720 | * 1/1989 | Lindner et al. | 257/110 |
| 4,927,770 | 5/1990 | Swanson | 136/256 |
| 5,164,019 | 11/1992 | Sinton | 136/249 |
| 5,609,694 | * 3/1997 | Asai | 136/255 |

OTHER PUBLICATIONS

Mulligan et al, "Development of Chip–Size Silicon Solar Cells," Conference Record of the Twenty–Eighth IEEE Photovoltaic Specialists Conference, Sep. 15–22, 2000, pp. 158–163.*

Davis, J.R. and Rohatgi, A., "Theoretical Design Considerations for Back Surface Field Solar Cells", Westinghouse Research and Development Center, Fourteenth IEEE Photovoltaic Specialists Conference, Jan. 1980.

* cited by examiner

Primary Examiner—Alan Diamond
(74) Attorney, Agent, or Firm—Townsend and Townsend and Crew LLP; Henry K. Woodward

(57) ABSTRACT

Edge passivation for a small area silicon cell is provided in a batch process by providing streets between individual cells formed in a silicon substrate and diffusing dopant through the substrate along the streets. Following completion of fabrication of the plurality of cells in the substrate, the substrate is sawed along the streets with the diffused region providing passivation along the edges of the individual die.

16 Claims, 1 Drawing Sheet

EDGE PASSIVATED SILICON SOLAR/PHOTO CELL AND METHOD OF MANUFACTURE

BACKGROUND OF THE INVENTION

This invention relates generally to silicon solar and photo cells, and more particularly the invention relates to a silicon cell with edge passivation and the method of manufacturing same.

The silicon solar cell is a well known device for use in converting radiant energy into electrical energy. See, for example, Swanson, U.S. Pat. No. 4,927,770, and Sinton, U.S. Pat. No. 5,164,019. As described in the Swanson patent, a silicon solar cell comprises a plurality of p and n conductivity type regions in a silicon body which generate voltage potential and a current when electron-hole pairs are created in a semiconductor body in response to impinging radiation, and the holes and electrons migrate to the p-doped regions and the n-doped regions, respectively. In a solar cell having interdigitated back surface contacts, the p and n regions are formed in alternating rows with a metal contact provided for contacting all doped regions in one row and with rows of like doped regions being connected in parallel.

Heretofore, small area solar cells having a surface area of less than 50 cm$^2$ have been batch processed in an intrinsic (including lightly doped) single crystal silicon substrate by the selective diffusion of n+ and p+ regions in one surface of the substrate. The wafer is subsequently scribed and broken or sawed into a plurality of small individual chips or cells. Because small solar cells are normally sawed from a wafer after metallization, traditional high-temperature passivation techniques such as surface doping or thermal oxide growth cannot be used for edge passivation. Further, low temperature passivating films or coatings are less effective and are extremely difficult to selectively deposit on the sawed cell edges. Recombination of photogenerated carriers at the unpassivated edge surfaces can be a major current loss mechanism for high efficiency silicon solar cells, particularly for the small area solar cells.

SUMMARY OF THE INVENTION

In accordance with the invention, a small area silicon cell is provided with efficient edge passivation to reduce recombination of photogenerated carriers. The silicon cell in accordance with the invention is readily manufactured in a batch process in which edge passivation is provided before sawing the silicon substrate and forming the individual cells.

Briefly, a silicon cell in accordance with one embodiment of the invention comprises an intrinsic (including lightly doped) monocrystalline silicon chip having two opposing major surfaces, a plurality of n+ doped regions and p+ doped regions in one major surface, and a doped (n or p-type) peripheral region around the periphery of the silicon chip and extending from one major surface to the other major surface, the peripheral region functioning as a passivation layer for repelling carriers and reducing recombination of carriers. Preferably the n-type or p-type dopants used in forming the peripheral region are phosphorous and aluminum, respectively, due to their relatively high diffusion coefficients.

In fabricating the silicon solar cell in accordance with the above embodiment of the invention, an intrinsic including lightly doped monocrystalline silicon substrate is provided, and a repeating pattern of p-doped regions and n-doped regions are formed in one major surface with the pattern defining an individual solar cell. Each solar cell is separated from adjacent solar cells by streets along which the substrate is separated after cell fabrication to provide individual cells. Prior to fabrication of the individual cells, a doped region is formed in the streets extending from one major surface to the other major surface, the dopant concentration in the doped regions being at least 10 times greater than photogenerated carrier concentration in each solar cell or 10 times the substrate doping level (whatever is larger). Preferably, dopant is diffused from both major surfaces into the silicon substrate in doping the streets. Thereafter, the substrate is sawed to form each individual silicon solar cell die.

The invention and objections and features thereof will be more readily apparent from the following detailed description and the appended claims when taken with the drawing.

DESCRIPTION OF THE ILLUSTRATIVE EMBODIMENTS

Figure 1A:
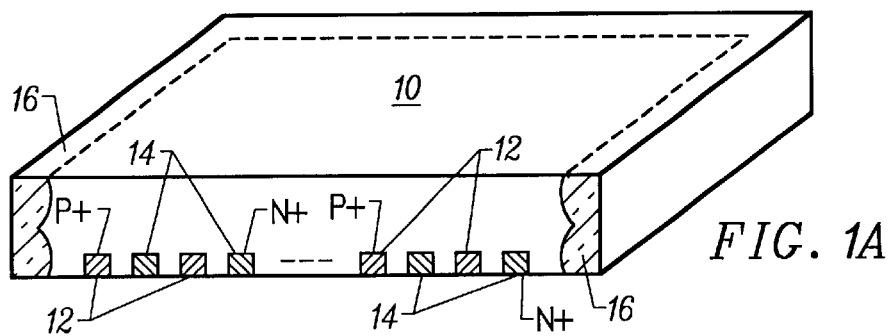
FIG. 1A is a perspective view in section illustrating one embodiment of a small silicon solar cell having edge passivation in accordance with the invention.

Referring now to the drawings, FIG. 1A is a perspective view in section illustrating one embodiment of a small silicon solar cell in accordance with the invention. The cell is fabricated in a silicon die 10 having two opposing major surfaces with the surface area being on the order of 4 mm$^2$. Silicon die 10 is an intrinsic monocrystalline silicon chip having two opposing surfaces. As used herein intrinsic material includes lightly doped semiconductor material. A pattern of p+ doped regions 12 and n+ doped regions 14 are formed in one surface of chip 10 in a repetitive pattern of interleaved rows. As described in the Swanson and Sinton patents, supra, the p+ rows and the n+ rows are respectively interconnected to form the contacts for the solar cell. Typical dopant concentration for the n+ and p+ regions is from $10^{19}$ to less than $10^{21}$ atoms/cm$^3$, for example $5 \times 10^{19} - 5 \times 10^{20}$ atoms/cm$^3$, and a typical dopant concentration for chip 10 is $10^{13} - 10^{14}$ atoms/cm$^3$.

The small solar cells are fabricated in a batch process in a silicon wafer using a repetitive pattern for the diffused p+ and n+ regions, with each pattern or cell separated from adjacent cells by streets or space for eventual sawing of the substrate and forming of the individual die. As noted above, recombination of photogenerated carriers at the unpassivated edge surfaces can be a major current loss mechanism for high efficiency silicon solar cells, particularly for small area solar cells. After sawing of the individual die when the batch fabrication and metallization is completed, traditional high temperature passivation techniques, such as surface doping or thermal oxidation growth cannot be used. Further, low temperature passivating films or coatings are less effective and are extremely difficult to selectively deposit only on the sawed cell edges.

In accordance with the invention, prior to the cell fabrication in the substrate, dopant is diffused through the substrate 10 in the streets thereby forming passivation regions 16 as shown in FIG. 1. Preferably the dopant concentration of passivation region 16 is at least 10 times greater than the photogenerated carrier concentration in the solar cell under concentrated sunlight operating conditions, or 10 times greater than the substrate doping level, whichever is greater. Further, passivation region 16 is preferably formed by diffusing dopants from both the front and back wafer surfaces in order to minimize process time and also limit the width of the passivation region by localized layer doping.

Figure 1B:
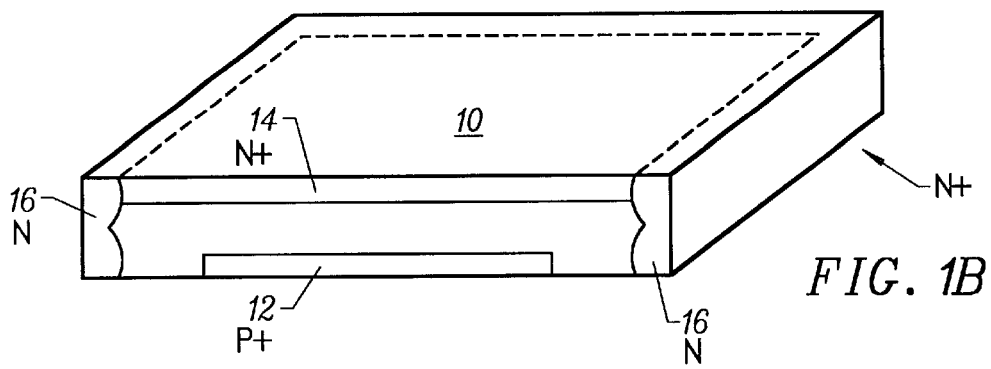
FIG. 1B is a perspective view in section illustrating another embodiment of a small silicon solar cell having edge passivation in accordance with the invention.

FIG. 1B is a perspective view in section illustrating another embodiment of the invention similar to the solar device of FIG. 1, but in which opposite surfaces of the silicon chip 10 has a p+ region 12 in one major surface and a n+ region 14 in the opposite major surface. The passivation region 16 is n-type and contacts n+ region 14. Alternatively, the passivation region 16 can be p-type and contact p+ region 12.

Figure 2:
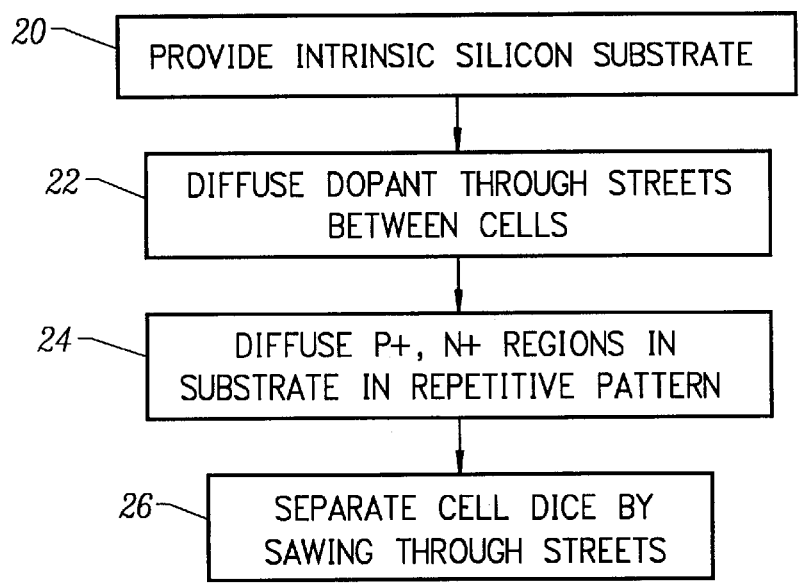
FIG. 2 is a flow diagram of steps in fabricating the small silicon solar cell of FIG. 1.

FIG. 2 is a functional diagram illustrating steps in batch fabricating the small area silicon solar cells. First, as shown at 20 an intrinsic including lightly doped silicon substrate is provided with the substrate having opposing major surfaces which form the front and back surfaces of the cells.

Next, as shown at 22, n or p dopant is diffused into the substrates along the streets separating the individual cells thereby forming the passivation regions 16 of FIG. 1. Dopant concentration in the passivation region 16 is on the order of $5.10^{17}$ atoms/cm$^3$ and should be at least 10 times greater than the photogenerated carrier concentration in the solar cell under normal operating conditions. As noted above, to reduce processing time and the width of the edge passivation region 16, phosphorous and aluminum dopant is preferred due to their relatively high diffusion coefficients but boron or other dopant can be used.

Therefore, as shown at 24 the p+ and n+ regions 12, 14 are formed in the back surface of the wafer in a repetitive pattern thereby defining the individual solar cells. Dopant concentration of the p+ and n+ regions is on the order of $5.10^{19}$–$5.10^{20}$ atoms/cm$^3$. The p+ regions and the n+ regions are selectively interconnected by metallization and then at 26 the individual cells or dice are separated by sawing through the silicon substrate along the streets separating the individual dice.

The provision of the edge passivation for a small area silicon solar cell in accordance with the invention is readily accomplished in batch processing and reduces the recombination of photogenerated carriers at the edge surfaces. While the invention has been described with reference to a specific embodiment, the description is illustrative of the invention and is not to be construed as limiting the invention. For example, the invention is applicable with other conventional solar cells having opposite conducting type regions in opposite surfaces, back surface field cells as described by Davis and Rohatgi, "Theoretical Design Consideration for Back Surface Field Solar Cells," 14th *IEEE PUSE* (1980) pp. 569–573, and edge surface field solar cells as disclosed by Del Alamo et al., "High-Low Junctions For Solar Cell Applications," *Solid-State Electronics*, 24 (1981) pp. 533–538. The invention also encompasses small area photodiodes, photo sensors, photo-transistors and like devices where edge recombination at a saw-cut becomes important compared to photo generated current. Thus, various modifications and applications may occur to those skilled in the art without departing from the true spirit and scope of the invention as defined by the appended claims.

What is claimed is:

1. A silicon solar cell comprising an intrinsic monocrystalline silicon chip having two opposing major surfaces, a plurality of n+ doped regions and p+ doped regions in one major surface, and a doped peripheral region around the periphery of the silicon chip and extending from one major surface to the other major surface, the peripheral region functioning as a passivation layer for repelling carriers and reducing recombination of carriers.

2. The silicon solar cell as defined by claim 1 wherein the silicon chip is lightly doped n– relative to the peripheral region doping and the peripheral region is p or n doped.

3. The silicon solar cell as defined by claim 1 wherein the silicon chip is lightly doped p– relative to the peripheral region doping and the peripheral region is n or p doped.

4. The silicon solar cell as defined by claim 1 wherein the n-type dopant is phosphorous and the p-type dopant is selected from aluminum and boron.

5. A method of batch fabrication of silicon cells comprising the steps of:
   a) providing a monocrystalline silicon substrate having two major surfaces,
   b) forming a repeating pattern of cell regions in the substrate, each cell region being separated from adjacent cell regions by streets along which the cell regions are separated to provide individual cells,
   c) forming a peripheral doped region in the streets extending from one major surface to the other major surface before separating the cells, and
   d) separating the cells along the streets with the peripheral doped regions providing peripheral passivation for each cell.

6. The method as defined by claim 5 wherein step c) precedes step b).

7. The method as defined by claim 6 wherein step c) includes diffusing dopant from both major surfaces into the silicon substrate.

8. The method as defined by claim 6 wherein dopant concentration in the peripheral doped region is at least ten times greater than a photogenerated carrier concentration in each cell.

9. The method as defined by claim 6 wherein each cell includes n+ and p+ regions and wherein the monocrystalline silicon substrate is intrinsic and the dopant concentration of the n+ and p+ regions is from $10^{19}$ to less than $10^{21}$ atoms/cm3.

10. The method as defined by claim 6 wherein the dopant concentration in the peripheral doped region is at least ten times greater than a substrate doping level.

11. A method of batch fabrication of silicon cells comprising the steps of:
   a) providing a monocrystalline silicon substrate having two major opposing surfaces,
   b) forming a repeating pattern of p-doped and n-doped regions in at least one major surface with a pattern defining an individual cell, each cell being separated from adjacent cells by streets along which the substrate is separated after cell fabrication to provide individual cells,
   c) forming a peripheral doped region in the streets extending from one major surface to the other major surface before separating the cells, and
   d) separating the cells along the streets with the peripheral doped region providing peripheral passivation for each cell.

12. The method as defined by claim 11 wherein step c) includes diffusing dopant from both major surfaces into the silicon substrate.

13. The method as defined by claim 11 wherein dopant concentration in the peripheral doped region is at least ten times greater than a photogenerated carrier concentration in each cell.

14. The method as defined by claim 11 wherein each cell includes n+ and p+ regions and wherein the monocrystalline silicon substrate is intrinsic and the dopant concentration of the n+ and p+ regions is from $10^{19}$ to less than $10^{21}$ atoms/cm3.

15. The method as defined by claim 11 wherein the dopant concentration in the peripheral doped region is at least ten times greater than a substrate doping level.

16. The method as defined by claim 11 wherein step c) precedes step b).

* * * * *